(12) United States Patent
Sugino

(10) Patent No.: US 7,911,015 B2
(45) Date of Patent: Mar. 22, 2011

(54) INFRARED DETECTOR AND INFRARED SOLID-STATE IMAGING DEVICE

(75) Inventor: Takaki Sugino, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/418,007

(22) Filed: Apr. 3, 2009

(65) Prior Publication Data

US 2009/0261445 A1      Oct. 22, 2009

(30) Foreign Application Priority Data

Apr. 3, 2008   (JP) ................. 2008-097120

(51) Int. Cl.
| | |
|---|---|
| H01L 27/14 | (2006.01) |
| H01L 31/00 | (2006.01) |
| H01L 31/0232 | (2006.01) |
| H01L 31/06 | (2006.01) |
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/417 | (2006.01) |
| H01L 29/74 | (2006.01) |
| H01L 31/111 | (2006.01) |
| H01L 25/00 | (2006.01) |
| G01J 5/00 | (2006.01) |
| G01J 5/20 | (2006.01) |
| G01J 5/02 | (2006.01) |

(52) U.S. Cl. ........ 257/431; 257/21; 257/117; 257/118; 257/432; 257/461; 257/E31.054; 250/332; 250/338.1; 250/338.4; 250/341.4

(58) Field of Classification Search ............... 257/21, 257/117–118, 431–432, 461, E31.054; 250/332, 250/338.1, 338.4, 341.4
See application file for complete search history.

(56) References Cited

U.S. PATENT DOCUMENTS

| | | | | | |
|---|---|---|---|---|---|
| 5,021,663 | A | * | 6/1991 | Hornbeck | ............. 250/349 |
| 5,100,829 | A | * | 3/1992 | Fay et al. | ............. 438/54 |
| 5,367,167 | A | * | 11/1994 | Keenan | ............. 250/338.4 |
| 5,650,622 | A | | 7/1997 | Ookawa et al. | ............. 250/332 |
| 6,060,752 | A | * | 5/2000 | Williams | ............. 257/355 |

(Continued)

FOREIGN PATENT DOCUMENTS

JP          2005-9998          1/2005

Primary Examiner — Ida M Soward
(74) Attorney, Agent, or Firm — Oblon, Spivak, McClelland, Maier & Neustadt, L.L.P.

(57) ABSTRACT

An infrared detector includes a first PN junction diode and a second PN junction diode which are formed in a silicon layer formed apart from a support substrate, the silicon layer having a P-type first region and an N-type second region, wherein the first PN junction diode is composed of the P-type first region and an N-type first region formed in the P-type first region at a position separated from the N-type second region, and the second PN junction diode is composed of the N-type second region and a P-type second region formed in the N-type second region at a position separated from the P-type first region, and wherein the first PN junction diode and the second PN junction diode are connected by a metal film formed on a surface of a concave portion spreading both of the P-type first region and the N-type second region.

11 Claims, 8 Drawing Sheets

U.S. PATENT DOCUMENTS

| | | | |
|---|---|---|---|
| 6,111,423 A * | 8/2000 | Imoto | 324/769 |
| 6,211,520 B1 | 4/2001 | Ishikawa et al. | 250/338.1 |
| 6,300,632 B1 * | 10/2001 | Liu et al. | 250/338.4 |
| 6,465,784 B1 * | 10/2002 | Kimata | 250/332 |
| 6,504,153 B1 * | 1/2003 | Shigenaka et al. | 250/338.4 |
| 6,552,344 B1 * | 4/2003 | Sone et al. | 250/338.1 |
| 6,573,504 B2 * | 6/2003 | Iida et al. | 250/338.4 |
| 7,067,810 B2 * | 6/2006 | Shigenaka et al. | 250/332 |
| 7,170,059 B2 * | 1/2007 | Wood et al. | 250/338.1 |
| 7,384,826 B2 * | 6/2008 | Richieri | 438/140 |
| 2006/0097334 A1 * | 5/2006 | Suzuki et al. | 257/431 |
| 2007/0073807 A1 * | 3/2007 | Bobde | 709/203 |
| 2007/0152265 A1 * | 7/2007 | Moriyama et al. | 257/324 |

* cited by examiner

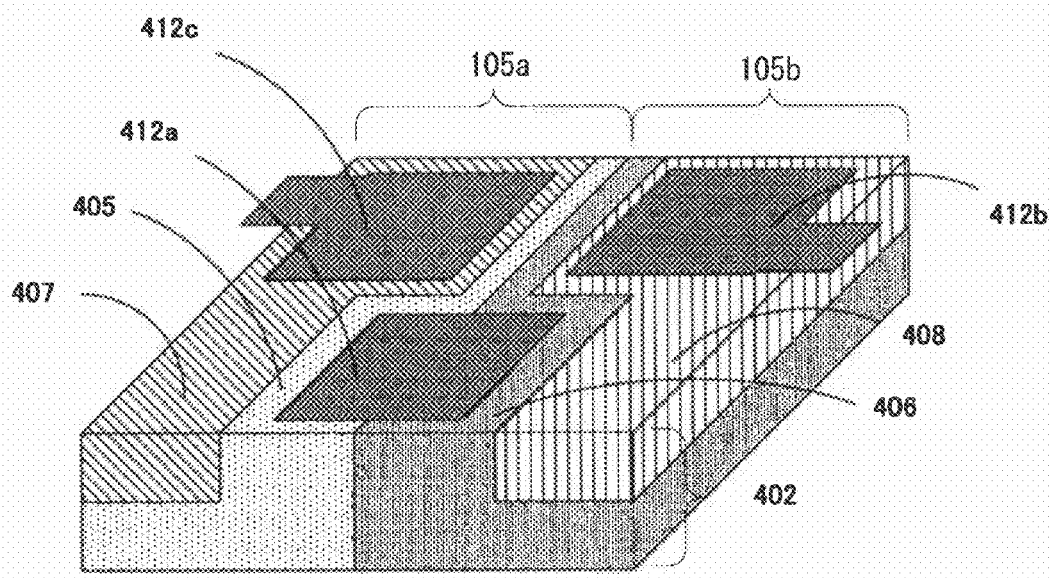

INFRARED DETECTOR AND INFRARED SOLID-STATE IMAGING DEVICE

This invention relates to infrared detectors and infrared solid state imaging device.

BACKGROUND OF THE INVENTION

Thermal infrared imaging device is a device that converts infrared rays absorbed by an infrared absorption structure to heat and temperature changes caused by the heat convert electric signals. Thermal infrared imaging device are grouped into cooling type and non-cooling type. The non-cooling type infrared solid state imaging element devices without freezer can be miniaturized and are becoming cheaper intended to be accepted by consumer. Against this backdrop, the non-cooling type infrared solid state imaging devices that silicon PN diodes are used as temperature sensors to share the process of standard LSI are developed. On the other hand, temperature changes of the silicon PN junction diode are extremely smaller than the other temperature sensors such as vanadium oxide type. Therefore, it is necessary to reduce a noise of the silicon PN junction diode in order to improve S/N ratio in the non-cooling type infrared solid state imaging device. In addition, it is necessary that an infrared temperature sensor portion composed of an infrared absorption portion that incident infrared rays are converted to heat and a thermoelectric conversion portion is separated from the substrate which has large heat capacity to improve the heat sensitivity in the non-cooling type infrared solid state imaging device. Therefore, a part of the silicon substrate under the infrared temperature sensor portion is removed by etching to form a cavity.

In the conventional infrared solid state imaging device, the PN junction diodes of the temperature sensor portion are formed on a silicon substrate or an SOI (Silicon on insulator) substrate in which a buried insulation thin layer and a single crystal silicon layer formed on a substrate (supporting substrate) in order. The each individual diode is formed on the silicon or SOI layer and has a structure that one or more P type impurity regions and one or more N type impurity regions are formed in the vertical direction. Since a temperature change of the each individual diode is small, a plurality of diodes are connected in series to enhance sensitivity of the temperature sensor (for example FIG. 1 of the patent document 1). In the patent document 1, a temperature sensor in which contact holes are formed inside of active regions and buried electrodes are formed at the bottoms of the contact holes to connect the diodes so as to be reverse-biased in order to suppress 1/f noise is proposed.

[Prior Art Document]
 [Patent Document]
  [PATENT DOCUMENT 1] JP2005-9998

SUMMARY OF THE INVENTION

However, since the interconnection layer connecting between the diodes is formed with metal silicide in such a conventional infrared temperature sensor, a difference in thermal expansion coefficient between metal silicide and silicon substrate on which the diodes are formed creates distortion at the temperature sensor portion with downsizing of picture elements. Even if metal layers are used instead of the metal siliside layers, a difference in thermal expansion coefficient between metal and silicon substrate creates distortion at the temperature sensor portion. As a result, a mechanical strength of the temperature sensor portion is lowered and reliability is degraded. A stress caused by distortion generates crystal defects inside of the silicon, which makes noise sources which increase 1/f noise. The conventional infrared temperature sensor described in the patent document 1 is weak against mechanical vibration and impact. Therefore, there is a problem that the conventional infrared temperature sensor is not suitable for transportable use such as mobile or monitoring. In addition, there is another problem that the noise of picture element increases and it is hard to improve 1/f noise.

Accordingly, it is an object of the present invention to provide a low noise infrared detector and a low noise infrared solid state imaging device in which mechanical distortion of the temperature sensor portion can be lowered.

To achieve the object, an infrared detector according to the present invention, has a first PN junction diode and a second PN junction diode which are formed in a silicon layer formed apart from a support substrate, the silicon layer having a P-type first region and an N-type second region. In the infrared detector, the first PN junction diode is composed of the P-type first region and an N-type first region formed in the P-type first region at a position separated from the N-type second region, the second PN junction diode is composed of the N-type second region and a P-type second region formed in the N-type second region at a position separated from the P-type first region, and the first PN junction diode and the second PN junction diode are connected by a metal film formed on a surface of a concave portion spreading both of the P-type first region and the N-type second region.

In the infrared detector constituted above according to the present invention, since the first PN junction diode and the second PN junction diode are connected by the metal film formed on a surface of a concave portion spreading both of the P-type first region and the N-type second region, a infrared detector and a infrared solid state imaging device in which a mechanical distortion of the infrared sensor portion and noise can be reduced is provided.

BRIEF DESCRIPTION OF THE DRAWINGS

FIG. 7 is an expanded perspective view of a part of the infrared detector 10 of Embodiment 4.

DETAILED DESCRIPTION OF THE PREFERRED EMBODIMENTS

Referring to accompanying drawings, the Embodiments of this invention will be described.

Embodiment 1

Figure 1:
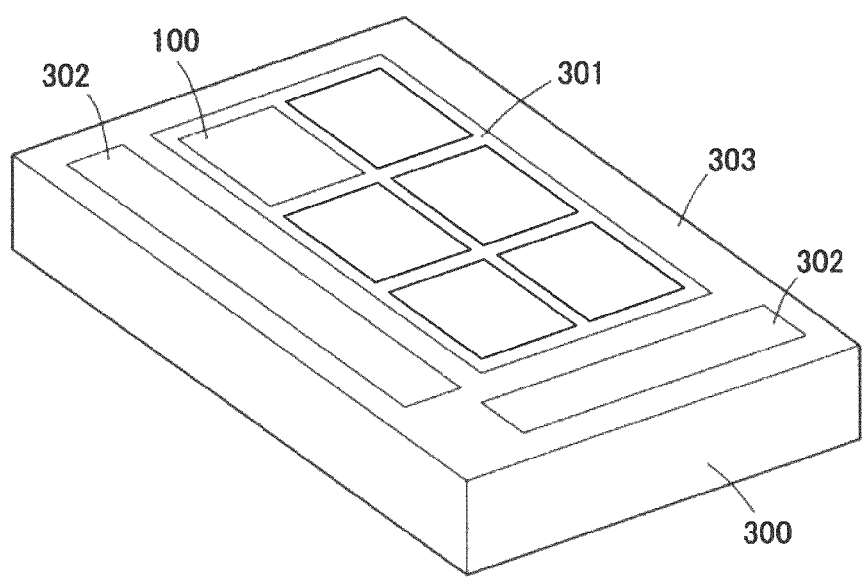
FIG. 1 is a perspective view illustrating a whole construction of an infrared solid state imaging device of an embodiment 1 according to the present invention.

As shown in FIG. 1, an infrared solid state imaging device 303 consists of an infrared detector array 301 including a plurality of infrared detectors 100 arranged in array and a signal readout circuit 302 which are formed on a support substrate 300. While an example provided with the six infrared detectors 100 arranged in array is shown in FIG. 1, more infrared detectors 100 are generally arranged.

Figure 2:
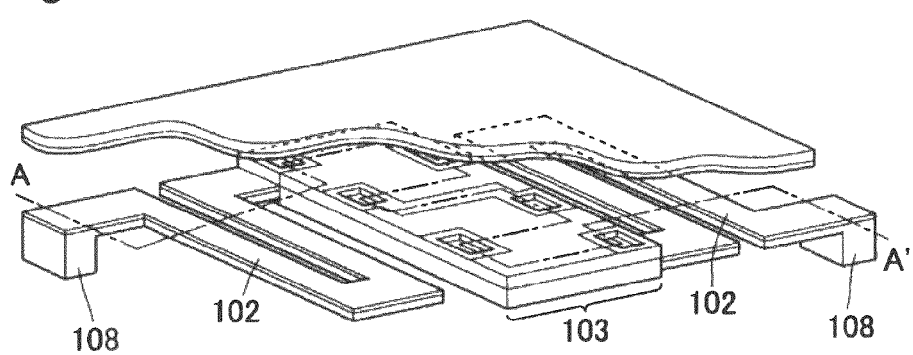
FIG. 2 is an expanded perspective view of the infrared detector 100 of FIG. 1.

FIG. 2 is an expanded perspective view which schematically illustrates one infrared detector 100. In FIG. 2, the protective film is omitted to make it easy to understand. As shown in FIG. 2, the infrared detector 100 has an infrared detection portion 103, support 102 for supporting the infrared detection portion 103 so as to separate from the support substrate 300 in midair and an infrared ray absorbent shade 101. One end of support 102 is fixed on the support substrate 300. In the Embodiment 1, the infrared detection portion 103 consists of a detection circuit in which four PN junction diodes 105 are connected in series. The detection circuit is connected to a detection circuit of the infrared detection portion 103 or a signal readout circuit with a conductive wiring formed on the support 102. The infrared ray absorbent shade 101 is connected to the infrared detection portion 103 and a changing of temperature of the infrared ray absorbent shade 101 irradiated with the infrared ray is transmitted to the infrared detection portion 103 (While this is shown in FIG. 3B, this is not shown in the other Figures). FIG. 3B is a sectional view taken on line A-A.

In the Embodiment 1, the infrared detection portion 103 is constituted by forming a plurality of PN junction diodes on a single crystal layer 402. In FIG. 2, etc, an example of an infrared detection portion 103 constituted by forming four PN junction diodes is showed. Further, a part (a part including two PN junction diodes 105) is enlarged in FIG. 3A.

Figure 3A:
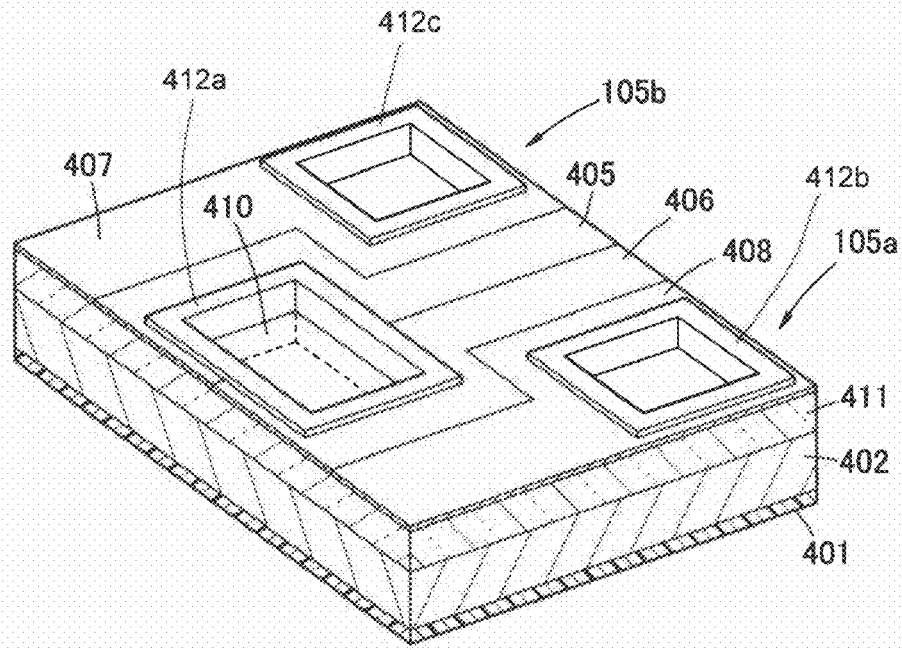
FIG. 3A is an expanded perspective view of a part of the infrared detector 100 of FIG. 2.
Figure 3B:
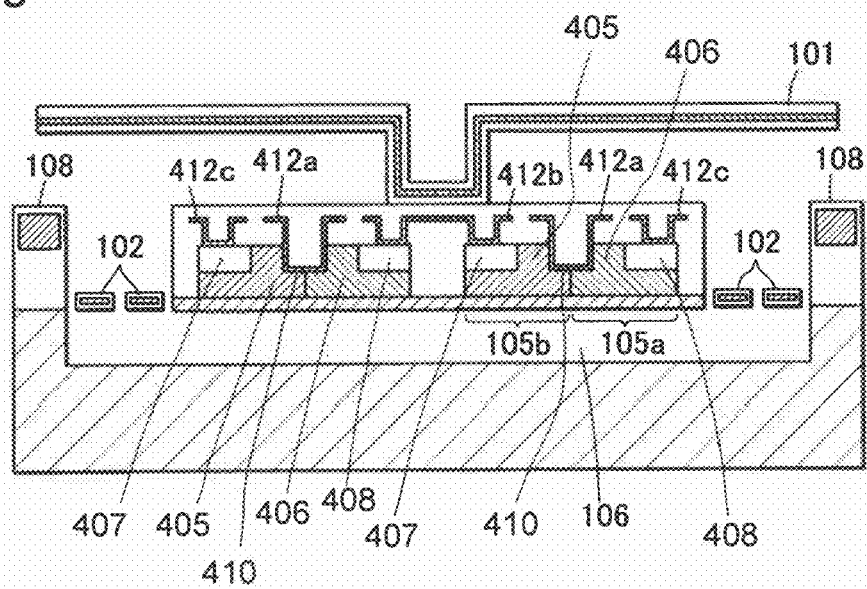
FIG. 3B is a schematic sectional view illustrating a section taken on line A-A.

In the infrared solid state imaging device 303, a special feature is in a connecting portion between the two PN junction diodes 105 adjacent each other showed in FIG. 3A. In detail, a P type impurities low doped layer 406 (P type first region) of one PN junction diode 105a and an N type impurities low doped layer 405 (N type second region) of the other PN junction diode 105b are connected with a metal interconnection layer 412a formed in a surface of a common contact hole (concave portion) 410 formed on the single crystal layer (silicon layer) 402 so as to extend over both of the P type impurities low doped layer 406 and the N type impurities low doped layer 405. This makes it possible to reduce a stress generated in the infrared detector 100 and reduce noise.

In more detail, in the Embodiment 1, as shown in FIGS. 3A and 3B, the first PN junction diode 105a of the infrared detection portion 103 is composed of the P type impurities low doped layer (P type first region) 406 and the N type impurities high doped layer (N type first region) 408 which is formed in the P type impurities low doped layer 406 at a position apart from the N type impurities low doped layer 405.

The second PN junction diode 105b is composed of the N type impurities low doped layer 405 and the P type impurities high doped layer 407 which is formed at a position apart from the P type impurities low doped layer 406 in the N type impurities low doped layer 405.

The common contact hole 410 is formed at a depth not reaching the buried oxide layer 401 in the single crystal layer 402 so as to extend both of over the P type impurities low doped layer 406 of the first PN junction diode 105a and the N type impurities low doped layer 405 of the second PN junction diode 105b. And the metal film 412a is formed on the surface of the common contact hole 410 so as to contact to both of the P type impurities low doped layer 406 and the N type impurities low doped layer 405.

In the embodiment 1, an another pair of a first PN junction diode 105a and a second PN junction diode 105b are formed. The P type impurities high doped layer 407 of the second PN junction diode 105b of one pair and the N type impurities high doped layer of the first PN junction diode 105a of the other pair are connected with the metal film 412b.

As described above, the two sets each including a particular feature in the connecting structure of the first PN junction diode 105a and the second PN junction diode 105b are formed to form an infrared detector 100 in which the four PN junction diodes are connected in series in the embodiment 1, which improve sensitivity. Although, the example of the infrared detector 100 in which the four PN junction diodes are connected in series is showed in the embodiment 1, the present invention is not limited by this construction. The infrared detector may be composed of at least two PN junction diodes which are connected.

A production method of the infrared solid state imaging device of Embodiment 1 will be described based on FIGS. 4A-4E.

Figure 4A:
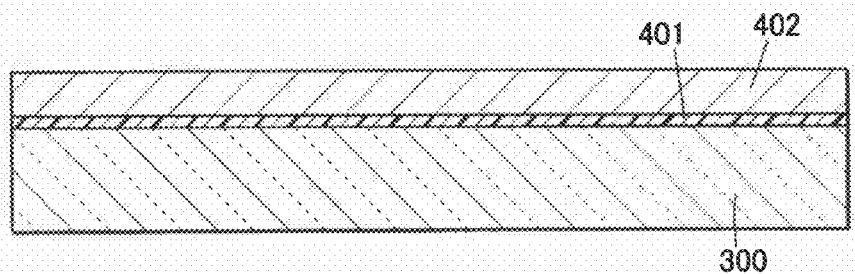
FIG. 4A is a sectional view of an SOI substrate for forming an infrared solid state imaging device of Embodiment 1.

First, SOI substrate in which a buried silicon oxide film layer 401, a silicon single crystal layer 402 (SOI layer) are laminated in order on a support substrate 300 made of silicon is prepared (FIG. 4A).

Next, isolation regions 403a between picture elements are formed by LOCOS isolation method to separate every region (detection part region 404) that each infrared detector 100 is formed. At this moment, the detection part region 404 is separated into two regions by internal isolation region of device 403b. And the two PN junction diodes consist of the first PN junction diode 105a and the second PN junction diode 105b are formed as follow. A region where a signal processing circuit 302 is to be formed is formed on the support substrate 300.

Figure 4B:
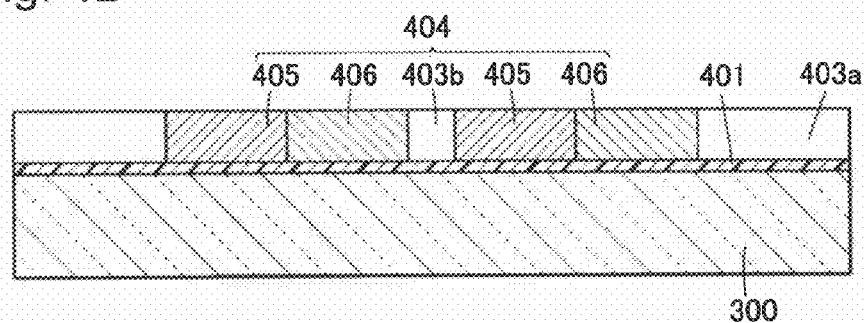
FIG. 4B is a sectional view of a first step of production process of the infrared solid state imaging device of Embodiment 1.
Figure 4C:
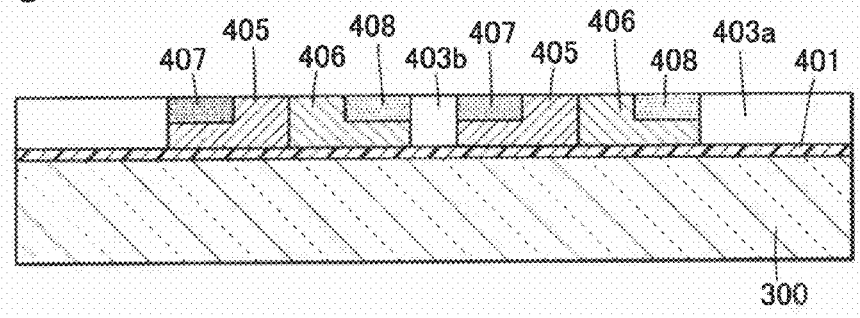
FIG. 4C is a sectional view of a second step of production process of the infrared solid state imaging device of Embodiment 1.

N type or P type impurities atoms are selectively implanted into each detection part region 404 up to a predetermined depth by an ion implantation device or the like from above the silicon single crystal layer to form the N type impurities low doped layer 405 and the P type impurities low doped layer 406 in each of the two regions separated by the internal isolation region of device 403b (FIG. 4B). The predetermined depth is defined as a depth which makes it possible to uniformize concentration of the impurities in whole of the SOI layer 402. In this embodiment, the internal isolation region of device 403b divided into two regions. And then in one of the two regions, the N type impurities low doped layer 405 and the P type impurities low doped layer 406 are formed so as to contact each other. And in the other of the two region, the N type impurities low doped layer 405 and the P type impurities low doped layer 406 are formed so as to contact each other.

Next, P-type impurities are selectively implanted to form a P type impurities high doped layer 407 in a part of the N type impurities low doped layer 405 at a predetermined depth. This predetermined depth is a depth which can prevents depletion layer from reaching up to a boundary face between the buried oxide layer 401 and the silicon single crystal layer 402.

In the same way, N-type impurities are selectively implanted to form an N type impurities high doped layer 408 in a part of the P type impurities low doped layer 406 at the predetermined depth. The P type impurities high doped layer 407 and the N type impurities high doped layer 408 are formed at a position apart from a boundary face between the N type impurities low doped layer 405 and the P type impurities low doped layer 406. To successively form the N type impurities low doped layer 405, the P type impurities low doped layer 406, the P type impurities high doped layer 407 and the N type impurities high doped layer 408 at the predetermined regions, a photoengraving process or the like are used together with the an ion implantation method. The P type impurities high doped layer is formed in the N type impurities low doped layer so as to have a concentration more than two orders in comparison with the N type impurities low doped layer and the N type impurities high doped layer is formed in the P type impurities low doped layer so as to have a concentration more than two orders in comparison with the P type impurities low doped layer.

Figure 4D:
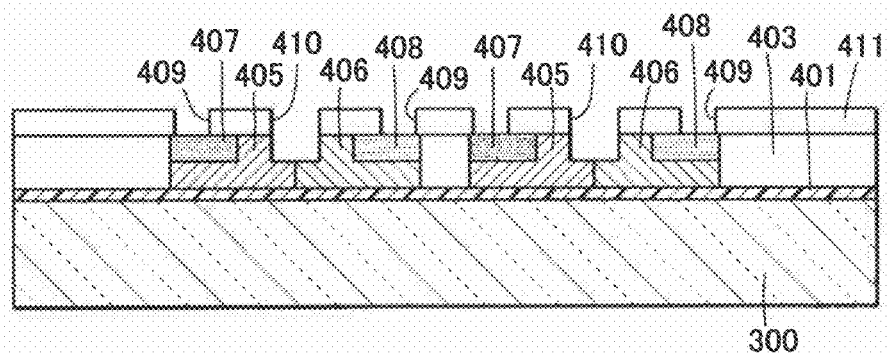
FIG. 4D is a sectional view of a third step of production process of the infrared solid state imaging device of Embodiment 1.

Next, an insulating oxide film 411 is deposited on a whole surface. And then, as shown in FIG. 4D contact holes 409 are formed at positions of the insulating oxide film 411 positioned on the P type impurities high doped layer 407 and the N type impurities high doped layer 408, which expose the P type impurities high doped layer 407 and the N type impurities high doped layer 408.

Continually, the common contact holes 410 lying on the N type impurities low doped layer 405 and the P type impurities low doped layer 406 are formed up to at a predetermined depth by, for example, dry etching method so as to penetrate the insulating oxide film 411 and reach part way of the N type impurities low doped layer 405 and the P type impurities low doped layer 406.
This predetermined depth is a depth which can minimize a influence affected by a boundary face (BOX boundary) between the buried oxide layer 401 and the silicon single crystal layer 402 and a boundary face between the SOI layer and the insulating oxide film which is formed upper side of the SOI layer. These boundaries are recognized as noise sources. To successively form the contact holes 409, 410 at the predetermined positions, a photoengraving process or the like are used.

Figure 4E:
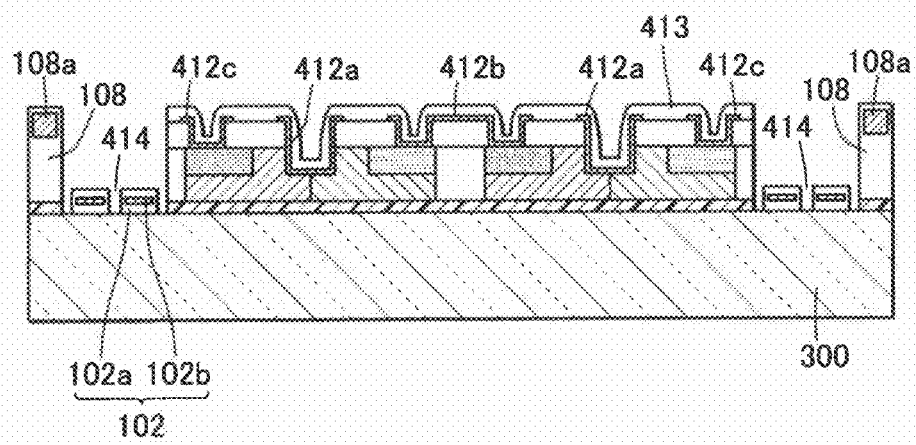
FIG. 4E is a sectional view of a fourth step of production process of the infrared solid state imaging device of Embodiment 1.

Next, as shown in FIG. 4E, to connect the PN junction diode to the other PN junction diode or the signal read out circuit, metal interconnection layers 412a, 412b and 412c. Simple description of the metal interconnection layer 412 means any of the metal interconnection layers 412a, 412b and 412c. The metal interconnection layers 412a are formed on the common contact holes 410 so as to cover holes, which minimize a total length of wiring in the detection part region 404. Of course, the metal interconnection layers 412 can be formed of metal silicide by ramp annealing technique. And then the metal interconnection layers 412 are covered with an insulating film 413.

Next, in the silicon single crystal layer 402 and the buried silicon oxide film layer 401, portions which are positioned at predetermined areas of the device isolation region 403 are removed to form openings reaching the support substrate 300, which separates the detection part region 404 from the anchor parts 108. The anchor parts 108 are formed in the device isolation regions 403 and wirings for connecting between the elements are formed on anchor parts 108.

Next, a support 102 which consists of conductive wiring 102b and a protective film 102a covering the conductive wiring 102b is formed on a portion of a surface of the support substrate 300 exposed by opening 414. The conductive wiring 102b connects metal interconnection layer 412c to the wiring 108a.

And then an etchant such as TMAH (Tetra-Methyl-Ammonium-Hydroxide) is introduced through the opening 414 to form the hollow portion 106 in the support substrate 300 made of single crystal silicon. Thus, the infrared solid state imaging device 303 provided with the infrared detector 100 supported by the support 102 composed of the protective film 102a and the conductive wiring 102b covered with the protective film 102a is completed.

In the infrared solid state imaging device 303 including a plurality of the infrared detectors 130, when a infrared ray irradiated from an object to be detected is irradiated to the infrared detectors 100 of the detector array 301, the temperatures of the infrared detectors 100 change in accordance with a strength of the irradiated infrared ray, thereby changing the electric characteristics of the infrared detector 100. The signal processing circuit 302 reads the changing of the electric characteristics at every infrared detector 100 and output. With this, thermal imagery of the object can be offered. A temperature sensitivity of the infrared detector 100 is improved with increasing the temperature change in electric characteristics of the infrared detector 100 or with is decreasing a noise generated by the infrared detector 100.

However, to connect a plurality of the PN junction diodes in series, the metal interconnection layer for reverse bias connecting is required, causing distortion generated by a difference between the metal interconnection layer and the silicon single crystal layer, which generates noise.

In contrast with this, the common contact holes 410 are formed in concave shape between the PN junction diodes 105a, 105b and the metal interconnection layers 412a are formed so as to cover the inner surface of the common contact holes 410 in the Embodiment 1. Therefore, the distortion generated by a difference between the metal interconnection layer 412a and the silicon single crystal layer 402 and the direction of force forced by the distortion are dispersed, thereby preventing to become a large force that the infrared detector 100 would be curved. As a result, the stiffness of the infrared detector 100 as a whole against a distortion caused by thermal expansion can be increased, thereby decreasing a distortion generated by a difference in thermal expansion between the metal interconnection layer 412 and the silicon single crystal layer 402, which restrains noise. In addition, in this embodiment, since concave portions are formed in the silicon single crystal layer 402, the stiffness against mechanical vibration and impact in addition to the distortion caused by thermal expansion can be increased. Therefore, an infrared solid state imaging device 303 which resist mechanical vibration and impact can be provided.

In addition, in the embodiment 1, the common contact holes 410 are formed in concave shape, which makes it possible to increase a contacting area of a contact region between the metal interconnection layer 412a and the PN junction diode. Therefore, the relatively large contacting area can be secured even if the picture elements are downsized, which restrains from increasing a contacting resistance.

Therefore, the infrared solid state imaging device 303 of the embodiment 1 can be downsized while restraining from increasing S/N.

Moreover, the common contact holes are formed between the PN junction diode 105a and 105b, which makes it possible to eliminate a wiring which connect between the PN junction diode 105a and 105b. Therefore, a contacting resistance in the infrared detecting element, a wiring resistance of wiring between the diodes can be reduced. As a result, a load resistance of the infrared detecting element can be reduced, thereby reducing a noise.

The bottoms of the common contact holes are formed between a boundary between the buried oxide layer 401 and the silicon single crystal layer 402 and a boundary between the silicon single crystal layer and oxide film to be positioned apart from the both boundaries. With this, conductive carriers are transmitted through the single crystal layer 402 without influence of the boundaries, which makes it possible to extremely reduce noise.

Embodiment 2

An infrared solid state imaging device of the Embodiment 2 according to the present invention is the same as the infrared solid state imaging device 300 of the Embodiment 1 except that N type impurities high doped bottom layers 501 and P type impurities high doped bottom layers 502 and the common contact holes 410 are formed with a depth at portions near to boundaries between the N type impurities low doped layers 405 and the buried oxide layer and a boundary between the P type impurities low doped layers 406 and the buried oxide layer so as to reach the N type impurities high doped bottom layers 501 and the P type impurities high doped bottom layer 502.

Concretely, in the Embodiment 2, after forming the N type impurities low doped layer 405 and the P type impurities low doped layer 406 through the same processes as the embodiment 1, N type impurities are implanted into portions of the N type impurities low doped layer close to a boundary between the N type impurities low doped layer 405 and the buried oxide layer are implanted and P type impurities are implanted into portions of the P type impurities low doped layer 406 close to a boundary between the P type impurities low doped layer 406 and the buried oxide layer to form the N type impurities high doped bottom layer 501 and the P type impurities high doped bottom layer 502.

Figure 5A:
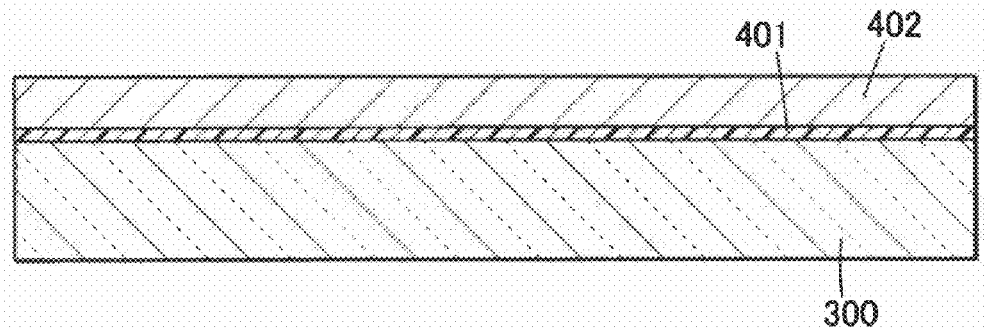
FIG. 5A is a sectional view of an SOI substrate for forming an infrared solid state imaging device of Embodiment 2.
Figure 5B:
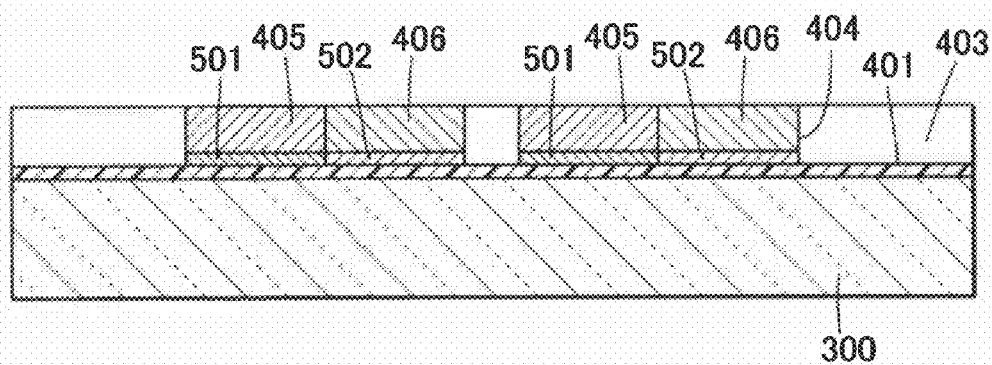
FIG. 5B is a sectional view of a first step of production process of the infrared solid state imaging device of Embodiment 2.
Figure 5C:
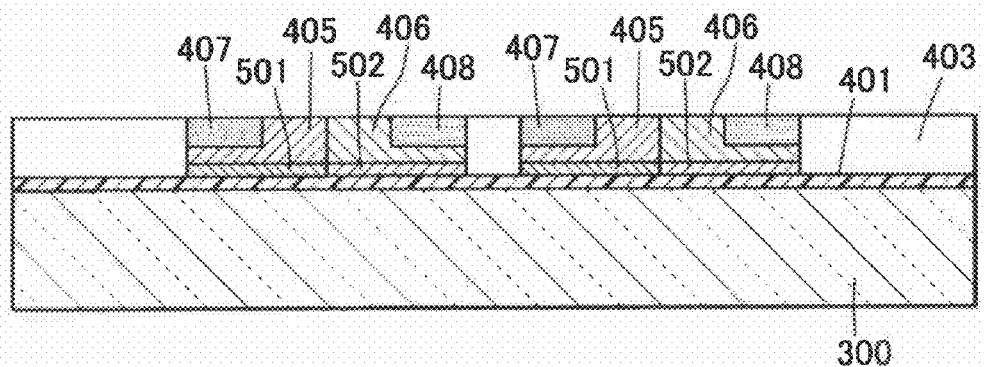
FIG. 5C is a sectional view of a second step of production process of the infrared solid state imaging device of Embodiment 2.

And then the P type impurities high doped layers 407 are formed at a predetermined depth in the N type impurities low doped layer 405 and the N type impurities high doped layers 408 are formed at a predetermined depth in the P type impurities low doped layer 406 by the way same as Embodiment 1 (FIG. 5C).

Figure 5D:
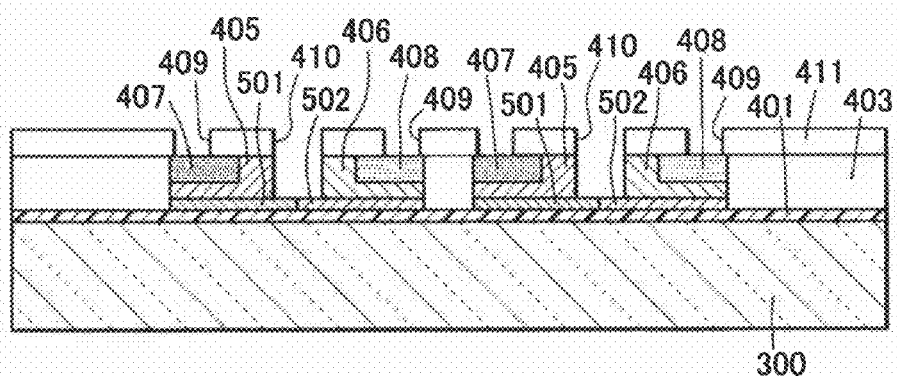
FIG. 5D is a sectional view of a third step of production process of the infrared solid state imaging device of Embodiment 2.

Next, after forming the insulating oxide film 411 on the whole surface, the contact holes 411 are formed directly on the P type impurities high doped layer 407 and the N type impurities high doped layer 408 by the way same as Embodiment 1 (FIG. 5D).

Successively, the common contact holes 410 are formed at a depth up to the N type impurities high doped bottom layer 501 and the P type impurities high doped bottom layer 502 (FIG. 5D) by using a dry etching etc.

Figure 5E:
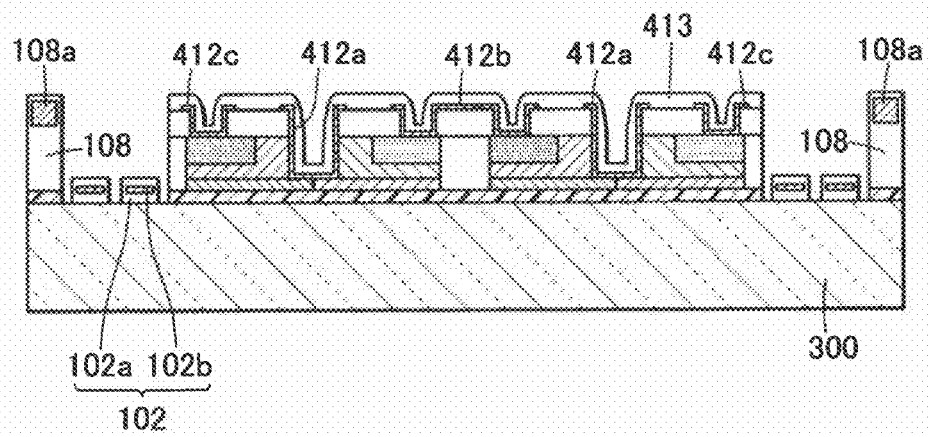
FIG. 5E is a sectional view of a fourth step of production process of the infrared solid state imaging device of Embodiment 2.

After that the infrared solid state imaging device is produced by the way same as Embodiment 1 (FIG. 5E).

In the infrared solid state imaging device constituted above of the Embodiment 2, the common contact holes 410 are formed at a depth up to the P type impurities high doped bottom layer 501 and the N type impurities high doped bottom layer 502, which compensates a diffusion resistance of the impurities low doped layers to decrease the resistance. Therefore, since the load resistance of the infrared detection portion can be reduced, an effect that noise can be lowered can be obtained in addition to the effects of the Embodiment 1. As an additional effect, a diffusion resistance of the boundary with the buried oxide layer 401 can be reduced, which enlarges the effective contact areas to realize an infrared detection portion which has a high sensitivity while small current density.

Aforementioned above, an infrared solid state imaging device which has low noise characteristic and high sensitivity, in which it is easy to be downsized and it is easy to be produced, can be provided in the Embodiment 2.

Embodiment 3

Figure 6A:
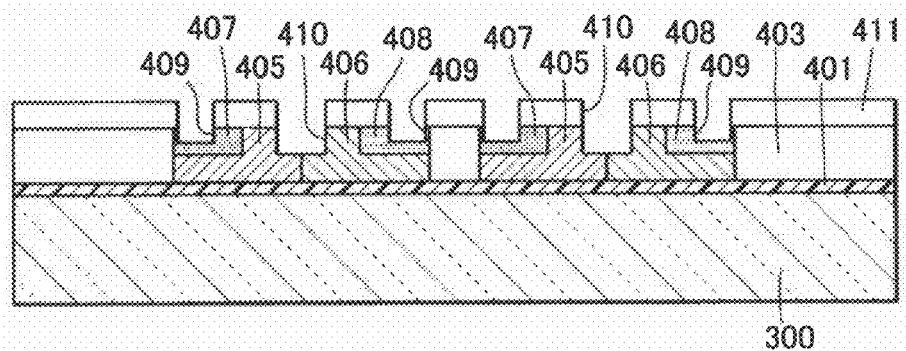
FIG. 6A is a sectional view of a step of production process of the infrared solid state imaging device of Embodiment 3.
Figure 6B:
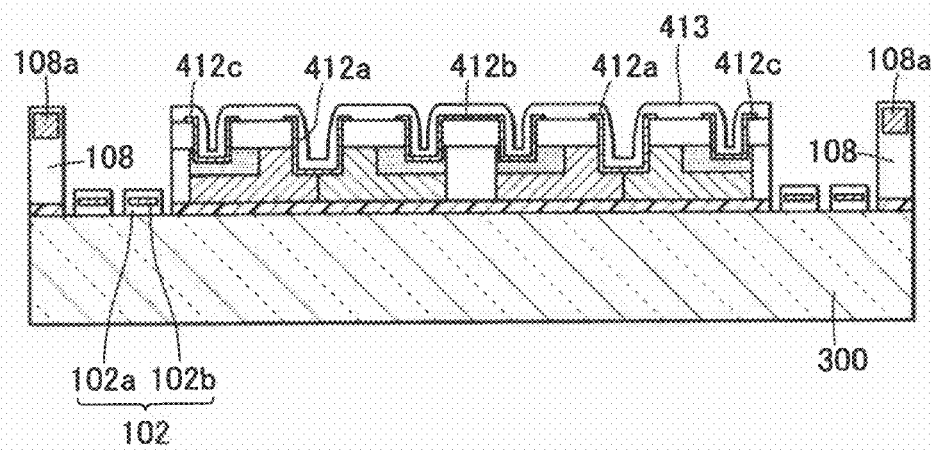
FIG. 6B is a sectional view of another step of production process of the infrared solid state imaging device of Embodiment 3.

An infrared solid state imaging device of the Embodiment 3 according to the present invention is the same as the infrared solid state imaging device 300 of the Embodiment 1 except that the contact holes 409 for connecting with the N type impurities high doped layer 408 of the PN junction diode 105a and the P type impurities high doped layer 407 the PN junction diode 105b are formed so that the N type impurities high doped layer 408 and the P type impurities high doped layer 407 are removed at a predetermined depth. In the process of the infrared solid state imaging device according to the Embodiment 3, steps different from the Embodiment 1 are showed in the FIGS. 6A and 6B. This predetermined depth is a depth where a wide margin can be ensured without being penetrated.

In this infrared solid state imaging device of the Embodiment 3, since the concave shapes of contact holes 409 are formed in the silicon single crystal layer in addition to the concave shapes of the common contact holes 410, a rigidity of the silicon single crystal layer 402 can be enhanced. Therefore, the deformation caused by a changing of temperature or an external force can be suppressed effectively, which makes it possible to provide an infrared solid state imaging device which has low noise characteristic and high sensitivity, in which it is easy to be produced.

In addition, the contact holes 409 of a concave shape ditched at the predetermined depth of the silicon single crystal layer 402 enlarges a contact area between the N type impurities high doped layer 408 or the P type impurities high doped layer 407 and the metal interconnection layer 412c, thereby making it possible to decrease a load resistance of the infrared detection portion, which can lower noise.

Embodiment 4

A infrared solid state imaging device of the Embodiment 4 according to the present invention is different from the Embodiments 1-3 in that the concaved portion 410 is not formed. That is, in the Embodiment 4, the metal interconnection layers 412a for connecting between the first PN junction diode 412a and the second PN junction diode 412b are formed on plane surfaces not having concave portions 410 so as to cover both of the N type impurities low doped layer and the P type impurities low doped layer 406

Concretely, in the infrared solid state imaging device of the Embodiment 4, without separating the PN junction diode 105a from the PN junction diode 105b, the P type impurities low doped layer 406 of the first PN junction diode 105a contacts with the N type impurities low doped layer 405 of the second PN junction diode 105b And the metal interconnection layers 412a are formed so as to cover both of the N type impurities low doped layer 405 and the P type impurities low doped layer 406.

The infrared detectors are separated every region same as the Embodiments 1-3.

In this infrared detector of the Embodiment 4, when the PN junction diode 105a and the PN junction diode 105b are operated with forward bias, the impurities low doped layers (the N type impurities low doped layer 405 and the P type impurities low doped layer 406) which are to be inverse bias are connected with the metal interconnection layer 412a.

With this configuration, it is possible to form common contacts between the PN junction diodes 105a and 105b, it is not necessary to form a wiring for connecting between the PN junction diodes 105a and 105b. Therefore, a contact resistance in the infrared detector and a wiring resistance between the diodes can be reduced. This makes it possible to reduce the load resistance of the infrared detector, thereby reducing noise.

A method for producing the first PN junction diode 105a and the second PN junction diode 105b so as to be adjacent without separating will be described below in detail.

First, to form the PN junction diodes 105, the N type impurities low doped layer 405 and the P type impurities low doped layer 406 are formed by implanting N-type or P-type impurities at a predetermined depth above the silicon single crystal layer with an ion implantation device etc. This predetermined depth is a depth in which a uniform concentration can be obtained in whole of the SOI layer 402.

In addition, to reduce number of photoechanical steps, N-type or P-type impurities are implanted on whole surface of each of the detection part regions from above the silicon single crystal layer at a predetermined depth with an ion implantation device etc. Subsequently, N-type impurities are selectively implanted into the places implanted with P-type impurities and P-type impurities are selectively implanted into the places implanted with N-type impurities at a predetermined depth by photoechanical method with an ion implantation device etc.

In the Embodiment 4, the N type impurities low doped layer 405 and the P type impurities low doped layer 406 are formed so as to contact with each other so that the first PN junction diode 105a and the second PN junction diode 105b contact with each other. That is, the N type impurities low doped layer 405 and the P type impurities low doped layer 406 are contacted without forming separation regions such as LOCOS separation region. And the N type impurities low doped layer 405 and the P type impurities low doped layer 406 are electrically connected at a position by the metal interconnection layer 412a so as to be connected in inverse bias.

The process for producing is same as the Embodiments 1, 2 or 3 except for producing a PN junction diode 105 aforementioned above. FIG. 7 illustrates only PN junction diode of infrared solid state imaging device according to Embodiment 4. To help understanding, the protective film is omitted to show only PN junction diode and metal interconnection layer.

In the infrared solid state imaging device constituted above of the Embodiment 4, it is not necessary to form a separation region for separating the first PN junction diode 105a from the second PN junction diode 105b, which makes it possible to improve integration degree compared with prior art. This makes it passable to downsize. In addition, since the first PN junction diode 105a and the second PN junction diode 105b are adjacent and contact each other, total contacting area to the separation region 403.

Therefore, an influence of a separation edge which causes noise can be reduced, thereby reducing noise compared with prior art. This effect makes it possible to provide the infrared solid state imaging device which has low noise characteristic and higher sensitivity, in which it is easy to be produced. In addition, a number of the masks in the photomechanical process is easily reduced, which makes it possible to reduce a production cost compared with prior art.

In addition, the metal interconnection layer are formed at only a part required for form a common contact between the first and second PN junction diode 105a, 105b. This makes it possible to connect between the first PN junction diode 105a and the second PN junction diode 105b without forming a wiring. Therefore, a distortion caused by a difference between metal and silicon in coefficient of thermal expansion, which makes it possible to reduce a load resistance of the infrared detecting element and noise.

What is claimed is:

1. An infrared detector comprising a first PN junction diode and a second PN junction diode which are formed in a silicon layer formed apart from a support substrate, the silicon layer having a P-type first region and an N-type second region,
   wherein the first PN junction diode is composed of the P-type first region and an N-type first region formed in the P-type first region at a position separated from the N-type second region, and
   the second PN junction diode is composed of the N-type second region and a P-type second region formed in the N-type second region at a position separated from the P-type first region, and wherein the first PN junction diode and the second PN junction diode are connected by a metal film formed on a surface of a concave portion spreading both of the P-type first region and the N-type second region.

2. An infrared solid state imaging device comprising a plurality of the infrared detectors according to claim 1.

3. The infrared detector according to claim 1, wherein each of the N-type first region and the P-type second region has a second concave portion which is different from the concave portion, each of the second concave portions provided with a second metal film.

4. An infrared solid state imaging device comprising a plurality of the infrared detectors according to claim 3.

5. The infrared detector according to claim 1, wherein a P-type first high doped layer having a impurities concentration higher than that of the P-type first region is formed under the P-type first region and an N-type second high doped layer having a impurities concentration higher than that of the N-type second region is formed under the N-type second region in the silicon layer, and wherein the P-type first high doped layer, the N-type second high doped layer and the metal film are connected at a bottom of the concave portion.

6. The infrared detector according to claim 5, wherein each of the N-type first region and the P-type second region has a second concave portion which is different from the concave portion, each of the second concave portions provided with a second metal film.

7. An infrared solid state imaging device comprising a plurality of the infrared detectors according to claim 5.

8. The infrared detector according to claims 1 or 5, wherein the N-type first region has an impurities concentration higher than that of the P-type first region and the P-type second region has an impurities concentration higher than that of the N-type second region.

9. The infrared detector according to claim 8, wherein each of the N-type first region and the P-type second region has a second concave portion which is different from the concave portion, each of the second concave portions provided with a second metal film.

10. An infrared solid state imaging device comprising a plurality of the infrared detectors according to claim 8.

11. A infrared detector comprising a first PN junction diode and a second PN junction diode which are formed in a silicon layer formed apart from a support substrate, the silicon layer having a P-type first region and an N-type second region, wherein the first PN junction diode is composed of the P-type first region and an N-type first region formed in the P-type first region at a position separated from the N-type second region, and the second PN junction diode is composed of the N-type second region and a P-type second region formed in the N-type second region at a position separated from the P-type first region, and wherein the first PN junction diode and the second PN junction diode are connected by a metal film formed on a partial surface spreading both of the P-type first region and the N-type second region.

* * * * *